(12) United States Patent
Ito

(10) Patent No.: US 11,189,506 B2
(45) Date of Patent: Nov. 30, 2021

(54) ROD-SHAPED LAMP AND HEAT TREATMENT APPARATUS

(71) Applicant: SCREEN HOLDINGS CO., LTD., Kyoto (JP)

(72) Inventor: Yoshio Ito, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 226 days.

(21) Appl. No.: 15/956,489

(22) Filed: Apr. 18, 2018

(65) Prior Publication Data
US 2018/0308726 A1 Oct. 25, 2018

(30) Foreign Application Priority Data

Apr. 24, 2017 (JP) .............................. JP2017-085386

(51) Int. Cl.
*H01L 21/67* (2006.01)
*H05B 3/00* (2006.01)
(Continued)

(52) U.S. Cl.
CPC .... *H01L 21/67115* (2013.01); *H01L 21/2686* (2013.01); *H01L 21/324* (2013.01);
(Continued)

(58) Field of Classification Search
CPC ........... H01L 21/67115; H01L 21/2686; H01L 21/324; H01L 21/68707; H01L 21/68735;
(Continued)

(56) References Cited

U.S. PATENT DOCUMENTS

| 4,714,857 A | * | 12/1987 | Goldstein | .............. H01K 1/325 |
| | | | | 313/112 |
| 5,382,874 A | * | 1/1995 | Johnson | ................. H01K 1/325 |
| | | | | 313/578 |

(Continued)

FOREIGN PATENT DOCUMENTS

| JP | 07-230795 A | 8/1995 |
| JP | 09-211234 A | 8/1997 |

(Continued)

OTHER PUBLICATIONS

Korean Notification of Reason for Refusal issued in corresponding Korean Patent Application No. 10-2018-0046772, dated Aug. 9, 2019, with English translation.

(Continued)

*Primary Examiner* — Sang Y Paik
*Assistant Examiner* — Diallo I Duniver
(74) *Attorney, Agent, or Firm* — McDermott Will & Emery LLP

(57) ABSTRACT

Halogen lamps arranged in two, upper and lower, tiers to intersect each other in a lattice pattern are provided under a chamber for receiving a semiconductor wafer therein. In a location where the halogen lamps in the upper and lower tiers overlap each other, a reflector is provided such that an outer wall surface of a glass tube of each halogen lamp is open on upper and lower sides. In the location where the halogen lamps in the upper and lower tiers overlap each other, light emitted upwardly from a halogen lamp in the lower tier is transmitted through the open upper and lower portions of the outer wall surface of the glass tube of a halogen lamp in the upper tier, and is directed further upwardly. Thus, the light is prevented from entering the glass tube of the halogen lamp in the lower tier again.

5 Claims, 10 Drawing Sheets

(51) Int. Cl.
*H01L 21/687* (2006.01)
*H01L 21/324* (2006.01)
*H01L 21/268* (2006.01)

(52) U.S. Cl.
CPC .... *H01L 21/6875* (2013.01); *H01L 21/68707* (2013.01); *H01L 21/68735* (2013.01); *H05B 3/0047* (2013.01)

(58) Field of Classification Search
CPC ... H01L 21/6875; H01L 21/26; H01L 21/683; H01L 21/677; H01L 21/67; H05B 3/0047; H01K 1/325
USPC ........ 392/393, 399, 401, 407–408, 411–416, 392/419–428, 431; 219/121.85, 411, 520
See application file for complete search history.

(56) References Cited

U.S. PATENT DOCUMENTS

| | | | | |
|---|---|---|---|---|
| 6,654,549 | B1* | 11/2003 | Konishi | H05B 3/008 219/541 |
| 6,707,011 | B2* | 3/2004 | Tay | H01L 21/67115 118/50.1 |
| 2004/0125593 | A1 | 7/2004 | Nam | |
| 2005/0100331 | A1 | 5/2005 | Konishi | |
| 2006/0186816 | A1* | 8/2006 | Kurosawa | H01K 1/30 313/635 |
| 2013/0203269 | A1 | 8/2013 | Yokouchi | |
| 2015/0063792 | A1* | 3/2015 | Ranish | H05B 3/0047 392/418 |
| 2017/0011922 | A1 | 1/2017 | Tanimura et al. | |

FOREIGN PATENT DOCUMENTS

| | | |
|---|---|---|
| JP | 2006-505123 A | 2/2006 |
| JP | 2008-198548 A | 8/2008 |
| JP | 2011-065759 A | 3/2011 |
| JP | 2016-181656 A | 10/2016 |
| JP | 2017-017277 A | 1/2017 |
| KR | 20-2010-0000972 U | 1/2010 |
| TW | 200517012 A | 5/2005 |

OTHER PUBLICATIONS

Taiwanese Office Action issued in corresponding Taiwanese Patent Application No. 107113815, dated Aug. 29, 2019, with partial English translation of the partial Japanese translation of the Taiwanese Office Action.
Korean Notice of Decision to Grant issued in corresponding Korean Patent Application No. 10-2018-0046772, dated Jan. 15, 2020, with English translation.
Taiwanese Office Action issued in corresponding Taiwanese Patent Application No. 107113815, dated Mar. 16, 2020, with partial English translation of the partial Japanese translation of the Taiwanese Office Action.
Japanese Notice of Reasons for Refusal issued in corresponding Japanese Patent Application No. 2017-085386, dated Feb. 24, 2021, with English translation.
Japanese Notice of Reasons for Refusal issued in corresponding Japanese Patent Application No. 2017-085386, dated Oct. 27, 2020, with English translation.

* cited by examiner

F I G . 1
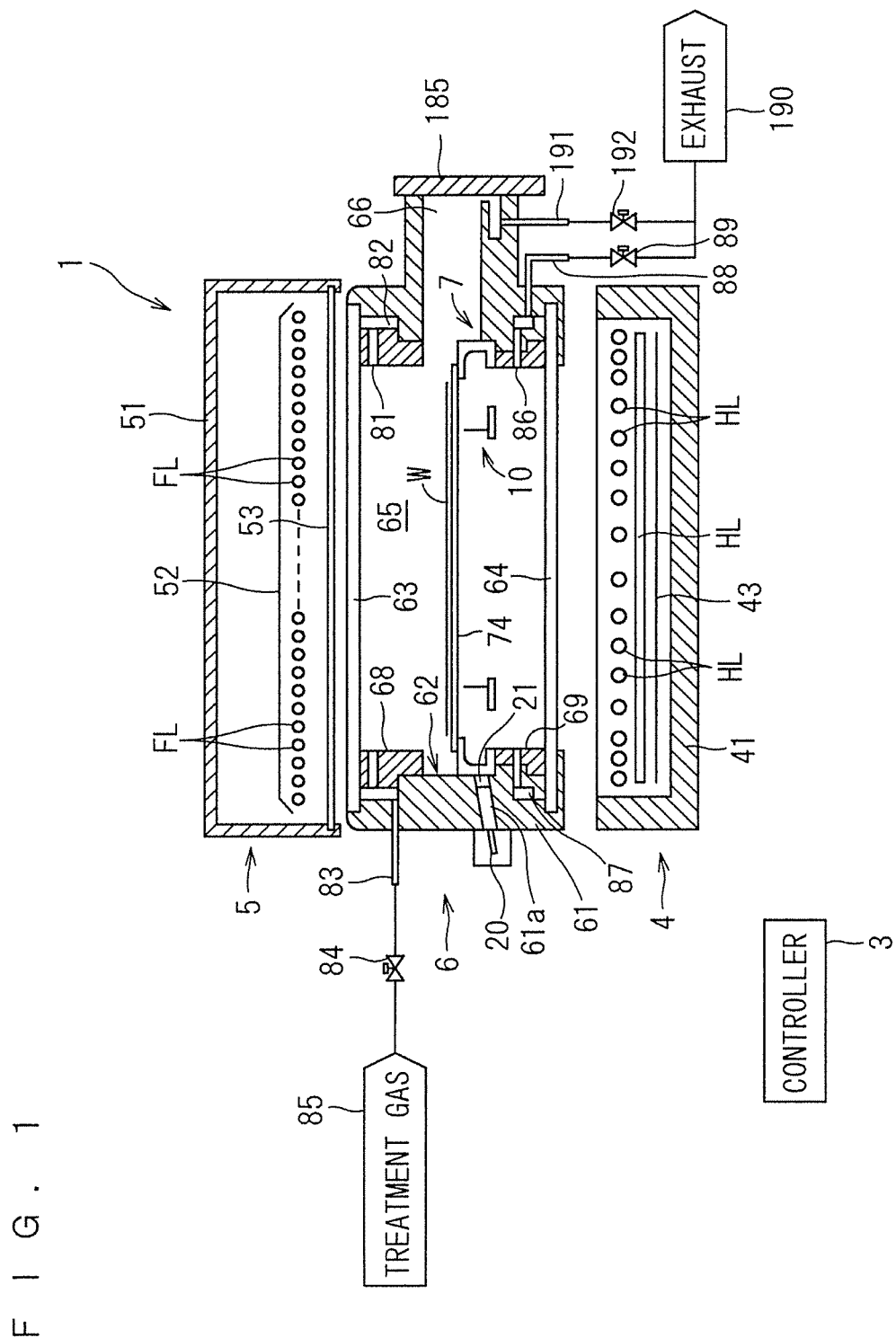

F I G. 3
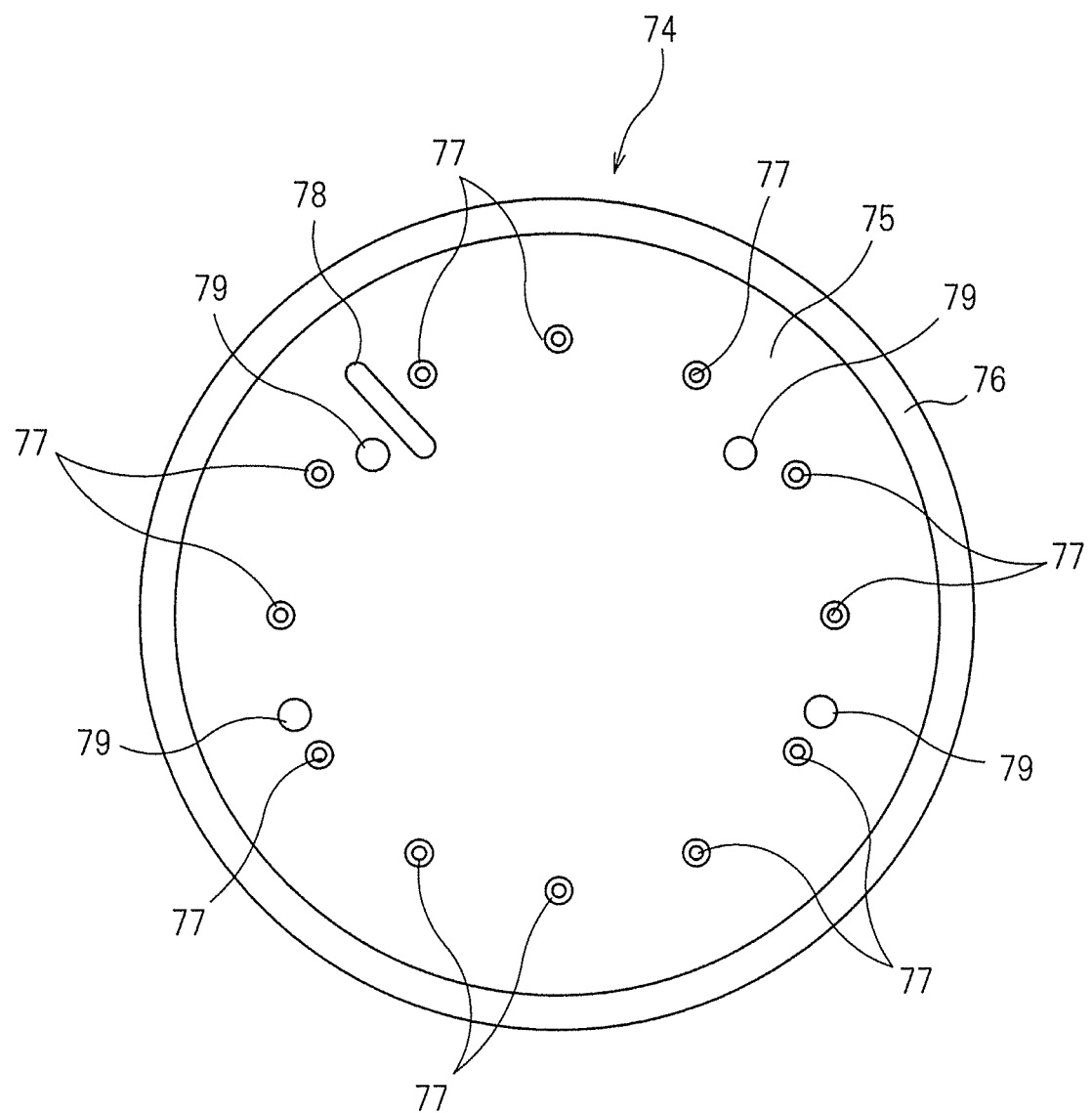

F I G. 5
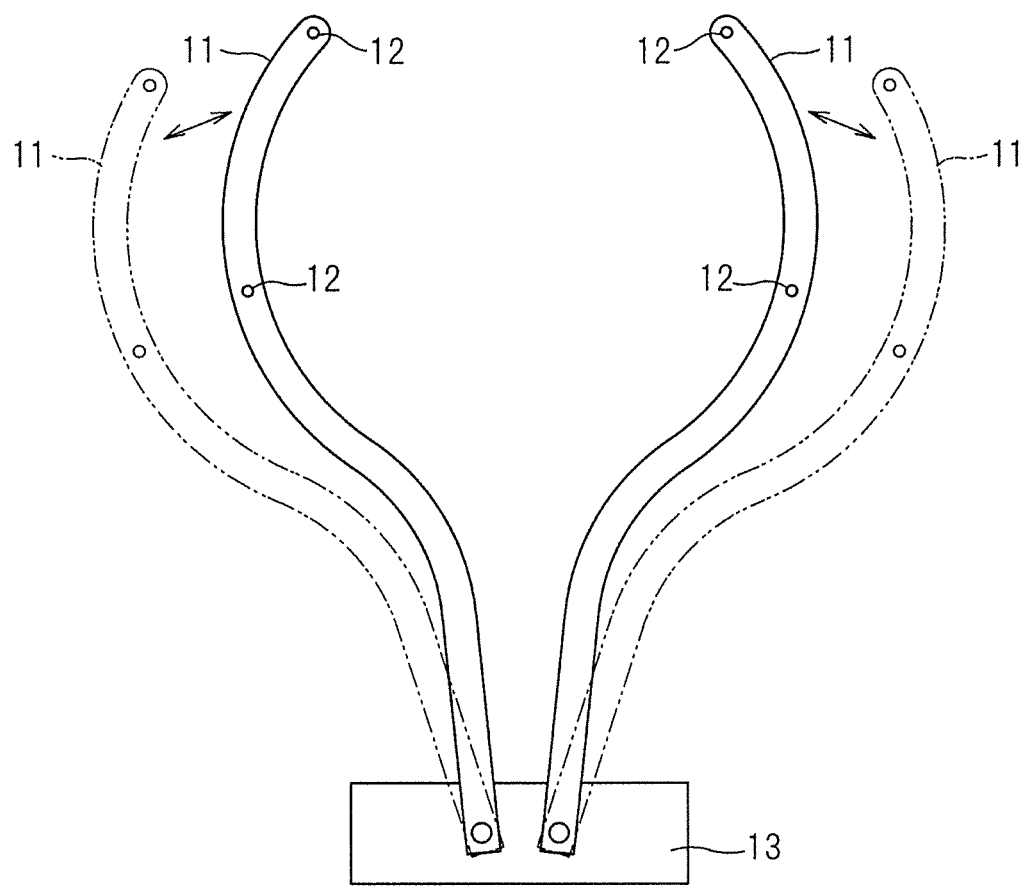

F I G. 6
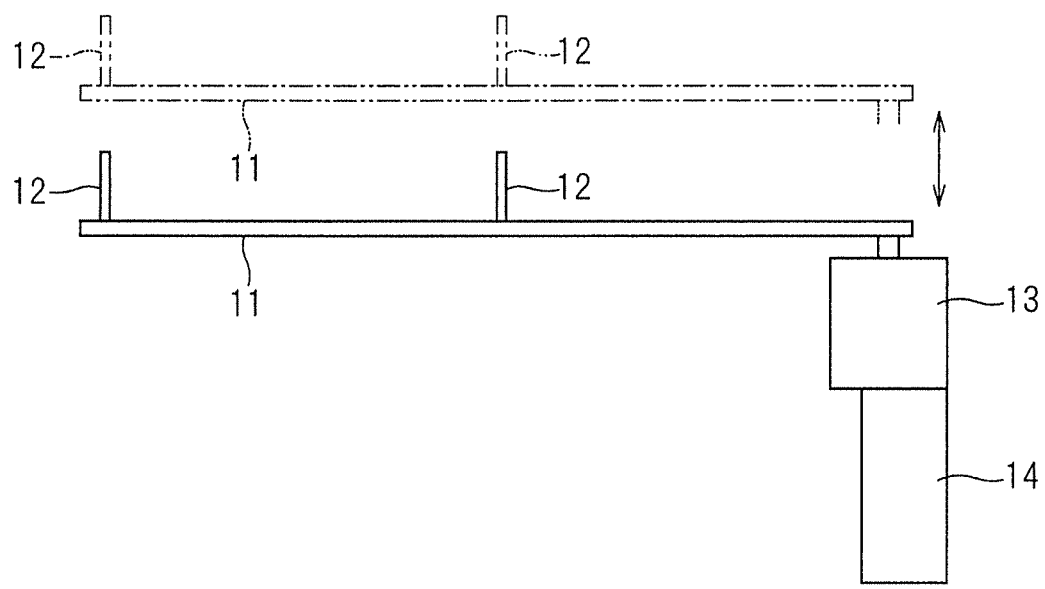

F I G . 1 1
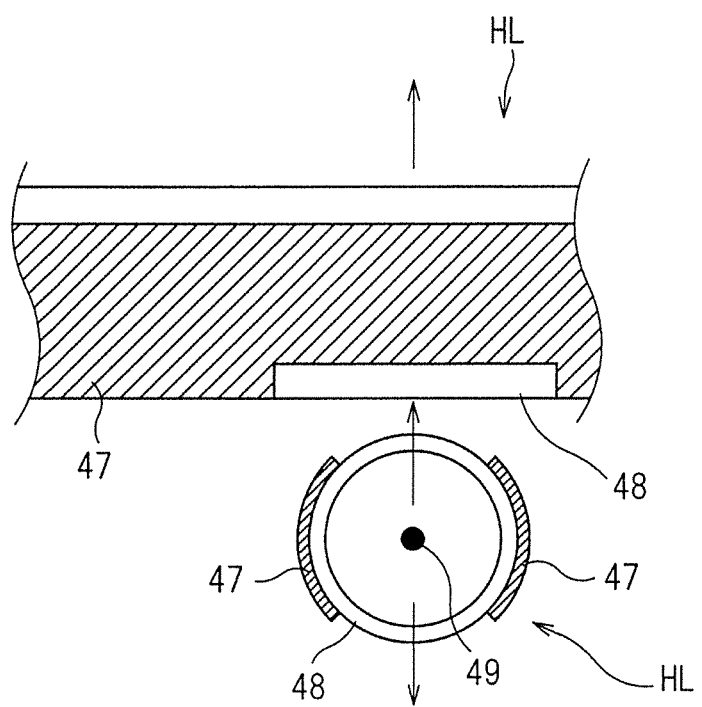

ROD-SHAPED LAMP AND HEAT TREATMENT APPARATUS

BACKGROUND OF THE INVENTION

Field of the Invention

The present invention relates to a rod-shaped lamp which irradiates a thin plate-like precision electronic substrate (hereinafter referred to simply as a "substrate") such as a semiconductor wafer with light to heat the substrate, and a heat treatment apparatus including the rod-shaped lamp.

Description of the Background Art

In the process of manufacturing a semiconductor device, impurity doping is an essential step for forming a pn junction in a semiconductor wafer. At present, it is common practice to perform impurity doping by an ion implantation process and a subsequent annealing process. The ion implantation process is a technique for causing ions of impurity elements such as boron (B), arsenic (As) and phosphorus (P) to collide against the semiconductor wafer with high acceleration voltage, thereby physically implanting the impurities into the semiconductor wafer. The implanted impurities are activated by the subsequent annealing process. When annealing time in this annealing process is approximately several seconds or longer, the implanted impurities are deeply diffused by heat. This results in a junction depth much greater than a required depth, which might constitute a hindrance to good device formation.

In recent years, attention has been given to flash lamp annealing (FLA) that is an annealing technique for heating a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising the temperature of only the surface of the semiconductor wafer implanted with impurities in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer. Therefore, the temperature rise in an extremely short time with the xenon flash lamps allows only the activation of impurities to be achieved without deep diffusion of the impurities.

A heat treatment apparatus employing such xenon flash lamps is disclosed in Japanese Patent Application Laid-Open No. 2016-181656 in which the flash lamps are disposed on the front surface side of a semiconductor wafer whereas halogen lamps are disposed on the back surface side thereof, so that a desired heat treatment is performed by the combination of the flash lamps and the halogen lamps. In the heat treatment apparatus disclosed in Japanese Patent Application Laid-Open No. 2016-181656, the semiconductor wafer is preheated to a certain degree of temperature by the halogen lamps, and the temperature of the semiconductor wafer is thereafter increased to a desired treatment temperature by pulse heating from the flash lamps. Also in the heat treatment apparatus disclosed in Japanese Patent Application Laid-Open No. 2016-181656, the halogen lamps are arranged to intersect each other in a lattice pattern, and a reflector is provided on a tube wall of each of the halogen lamps for the purpose of increasing the directivity of exiting light.

Unfortunately, there have been cases in which the provision of the reflector directly on an outer wall surface of a halogen lamp gives rise to a problem such that a glass tube of the halogen lamp is broken. In particular, when halogen lamps are arranged in two tiers, i.e. upper and lower tiers, to intersect each other in a lattice pattern as disclosed in Japanese Patent Application Laid-Open No. 2016-181656, a phenomenon in which glass tubes are broken due to melting at points of intersection of the upper and lower halogen lamps has occurred.

SUMMARY OF THE INVENTION

The present invention is intended for a rod-shaped lamp for heating a substrate.

According to one aspect of the present invention, the rod-shaped lamp comprises: a cylindrical glass tube; and a reflector provided on an outer wall surface of the glass tube, the reflector being provided such that the outer wall surface is open on one side of the glass tube as seen in a radial direction thereof and on the other side thereof opposite the one side.

Light emitted in the glass tube exits the outer wall surface on the one side and on the other side. This prevents the breakage of the glass tube.

The present invention is also intended for a heat treatment apparatus for heating a substrate by irradiating the substrate with light.

According to another aspect of the present invention, the heat treatment apparatus comprises: a chamber for receiving a substrate therein; a holder for holding the substrate in the chamber; and a plurality of rod-shaped lamps provided over or under the chamber and for irradiating the substrate held by the holder with light, the rod-shaped lamps being arranged in two, upper and lower, tiers in a lattice pattern, each of the rod-shaped lamps including a cylindrical glass tube, and a reflector provided on an outer wall surface of the glass tube, the reflector being provided such that the outer wall surface is open on upper and lower sides of the glass tube in a location where the rod-shaped lamps in the upper and lower tiers overlap each other.

Light emitted in the glass tube exits the outer wall surface on the upper and lower sides. This prevents the breakage of the glass tube.

It is therefore an object of the present invention to prevent the breakage of a glass tube of a rod-shaped lamp.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a longitudinal sectional view showing a configuration of a heat treatment apparatus according to the present invention;

FIG. 3 is a plan view of a susceptor;

FIG. 5 is a plan view of a transfer mechanism;

FIG. 6 is a side view of the transfer mechanism;

FIG. 11 is a view showing a phenomenon occurring in a location where the halogen lamps in the upper and lower tiers overlap each other when the reflector is provided such that upper and lower portions thereof are open.

DESCRIPTION OF THE PREFERRED EMBODIMENTS

Figure 2:
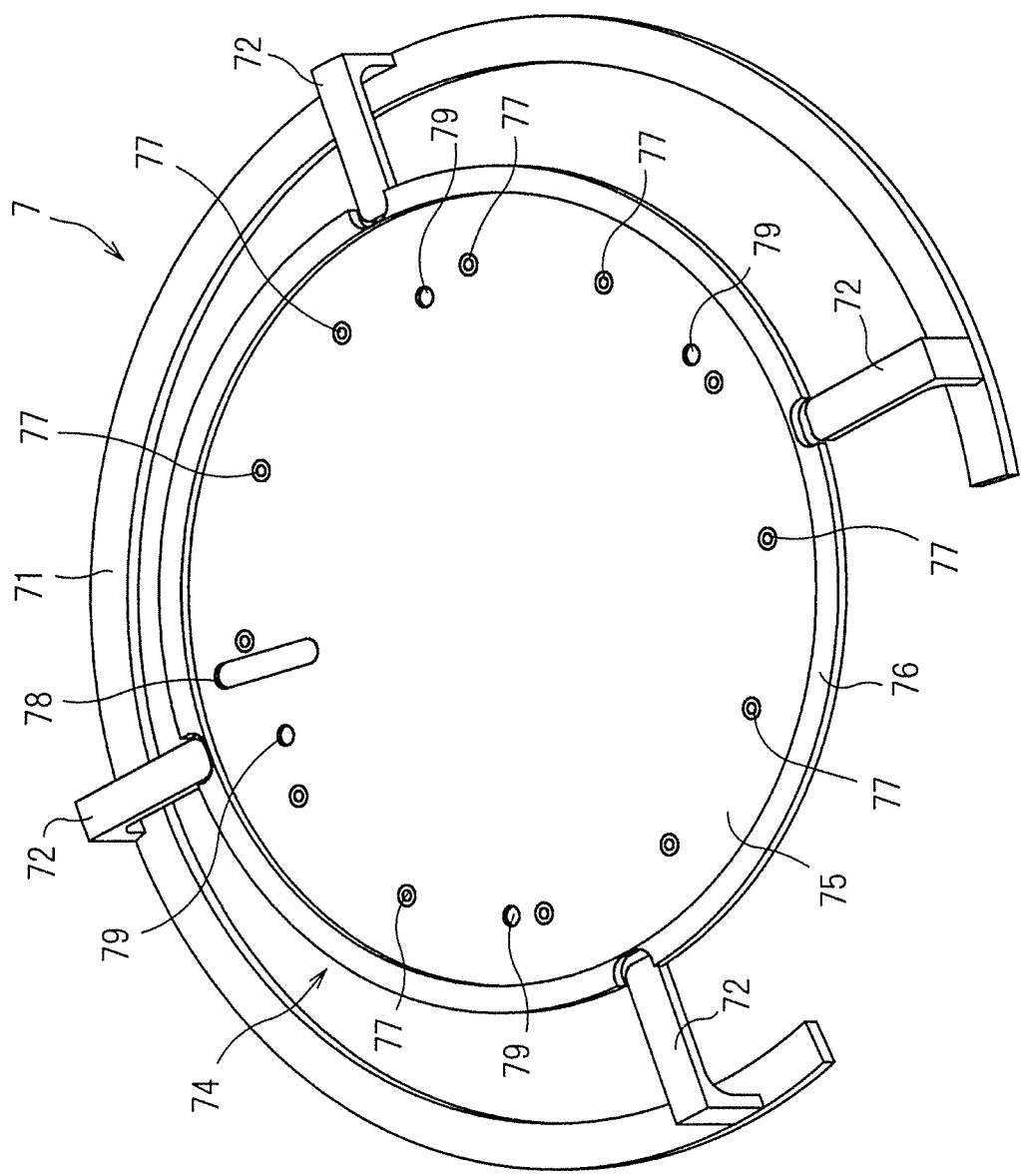
FIG. 2 is a perspective view showing the entire external appearance of a holder.

A preferred embodiment according to the present invention will now be described in detail with reference to the drawings.

FIG. 1 is a longitudinal sectional view showing a configuration of a heat treatment apparatus 1 according to the present invention. The heat treatment apparatus 1 of FIG. 1 is a flash lamp annealer for irradiating a disk-shaped semiconductor wafer W serving as a substrate with flashes of light to heat the semiconductor wafer W. The size of the semiconductor wafer W to be treated is not particularly limited. For example, the semiconductor wafer W to be treated has a diameter of 300 mm and 450 mm (in the present preferred embodiment, 300 mm). The semiconductor wafer W prior to the transport into the heat treatment apparatus 1 is implanted with impurities. The heat treatment apparatus 1 performs a heating treatment on the semiconductor wafer W to thereby activate the impurities implanted in the semiconductor wafer W. It should be noted that the dimensions of components and the number of components are shown in exaggeration or in simplified form, as appropriate, in FIG. 1 and the subsequent figures for the sake of easier understanding.

The heat treatment apparatus 1 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits flashes of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

The chamber side portion 61 is further provided with a through hole 61a bored therein. A radiation thermometer 20 is mounted to a location of an outer wall surface of the chamber side portion 61 where the through hole 61a is provided. The through hole 61a is a cylindrical hole for directing infrared radiation emitted from the lower surface of a semiconductor wafer W held by a susceptor 74 to be described later therethrough to the radiation thermometer 20. The through hole 61a is inclined with respect to a horizontal direction so that a longitudinal axis (an axis extending in a direction in which the through hole 61a extends through the chamber side portion 61) of the through hole 61a intersects a main surface of the semiconductor wafer W held by the susceptor 74. A transparent window 21 made of barium fluoride material transparent to infrared radiation in a wavelength range measurable with the radiation thermometer 20 is mounted to an end portion of the through hole 61a which faces the heat treatment space 65.

At least one gas supply opening 81 for supplying a treatment gas therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a treatment gas supply source 85. A valve 84 is inserted at some midpoint in the gas supply pipe 83. When the valve 84 is opened, the treatment gas is fed from the treatment gas supply source 85 to the buffer space 82. The treatment gas flowing in the buffer space 82 flows in a spreading manner within the buffer space 82 which is lower in fluid resistance than the gas supply opening 81, and is supplied through the gas supply opening 81 into the heat treatment space 65. Examples of the treatment gas usable herein include inert gases such as nitrogen gas ($N_2$), reactive gases such as hydrogen ($H_2$) and ammonia ($NH_3$), and mixtures of these gases (although nitrogen gas is used in this preferred embodiment).

At least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits. The treatment gas supply source 85 and the exhaust part 190 may be mechanisms provided in the heat treatment apparatus 1 or be utility systems in a factory in which the heat treatment apparatus 1 is installed.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

FIG. 2 is a perspective view showing the entire external appearance of the holder 7. The holder 7 includes a base ring 71, coupling portions 72, and the susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by a wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 and arranged in a circumferential direction of the annular shape thereof. The coupling portions 72 are quartz members, and are rigidly secured to the base ring 71 by welding.

Figure 4:
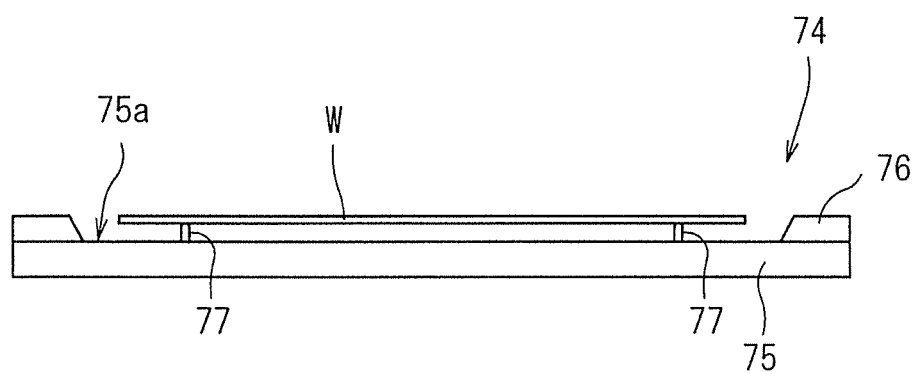
FIG. 4 is a sectional view of the susceptor.

The susceptor 74 is supported by the four coupling portions 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 provided upright are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is slightly smaller than the diameter of the semiconductor wafer W, and is 270 to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the susceptor 74 coincides with a vertical direction). In other words, the holding surface 75a of the holding plate 75 becomes a horizontal surface.

A semiconductor wafer W transported into the chamber 6 is placed and held in a horizontal attitude on the susceptor 74 of the holder 7 mounted to the chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W is supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 2 and 3, an opening 78 is formed in the holding plate 75 of the susceptor 74 so as to extend vertically through the holding plate 75 of the susceptor 74. The opening 78 is provided for the radiation thermometer 20 to receive radiation (infrared radiation) emitted from the lower surface of the semiconductor wafer W. Specifically, the radiation thermometer 20 receives the radiation emitted from the lower surface of the semiconductor wafer W through the opening 78 and the transparent window 21 mounted to the through hole 61a in the chamber side portion 61 to measure the temperature of the semiconductor wafer W. Further, the holding plate 75 of the susceptor 74 further includes four through holes 79 bored therein and designed so that lift pins 12 of the transfer mechanism 10 to be described later pass through the through holes 79, respectively, to transfer a semiconductor wafer W.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct flashes of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane. A region in which the flash lamps FL are arranged has a size, as seen in plan view, greater than that of the semiconductor wafer W.

Each of the xenon flash lamps FL includes a cylindrical glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. Such a xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heating part 4 provided under the chamber 6 includes an enclosure 41 incorporating the multiple (in the present preferred embodiment, 40) halogen lamps HL. The halogen heating part 4 is a light irradiator that directs light from under the chamber 6 through the lower chamber window 64 toward the heat treatment space 65 to heat the semiconductor wafer W by means of the halogen lamps HL.

Figure 7:
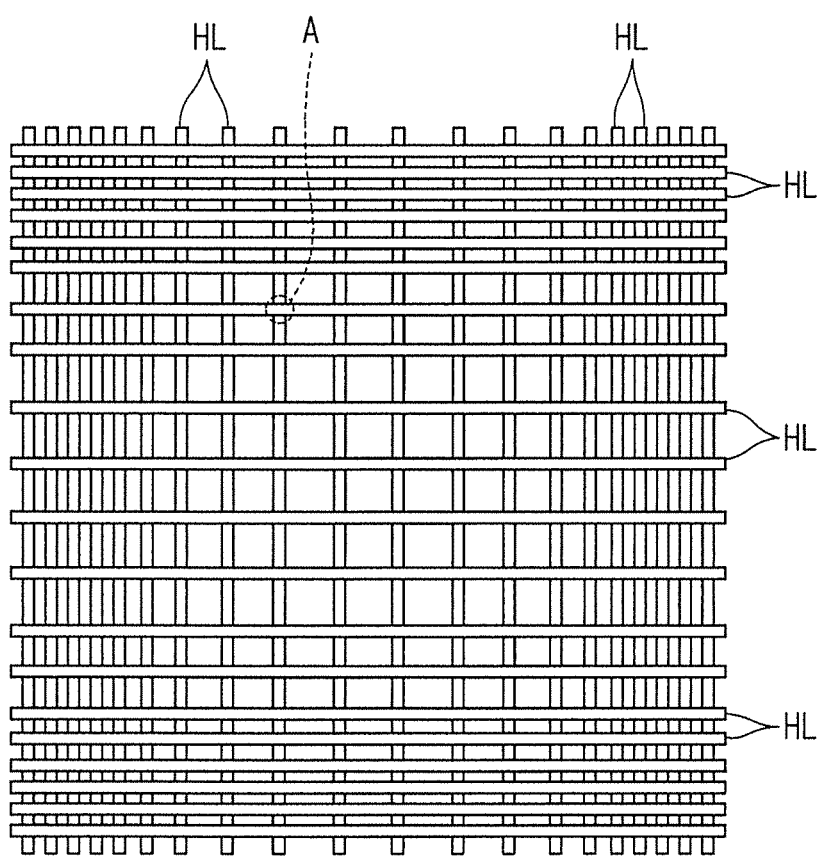
FIG. 7 is a plan view showing an arrangement of halogen lamps.

FIG. 7 is a plan view showing an arrangement of the multiple halogen lamps HL. The 40 halogen lamps HL are arranged in two tiers, i.e. upper and lower tiers. That is, 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to a peripheral portion of the semiconductor wafer W held by the holder 7 than in a region opposed to a central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a cylindrical glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. Thus, the halogen lamps HL are continuous lighting lamps that emit light continuously for at least not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4 and under the halogen lamps HL arranged in two tiers (FIG. 1). The reflector 43 reflects the light emitted from the halogen lamps HL toward the heat treatment space 65.

Figure 8:
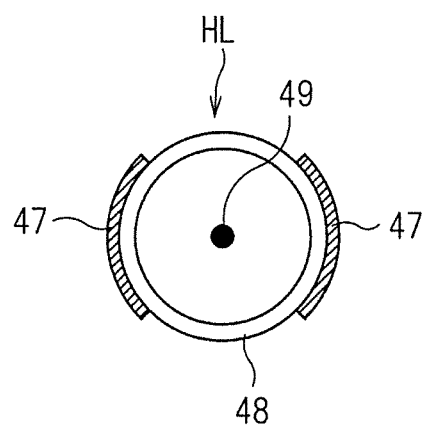
FIG. 8 is a view showing a reflector provided on a halogen lamp in a location where the halogen lamps in upper and lower tiers overlap each other.
Figure 9:
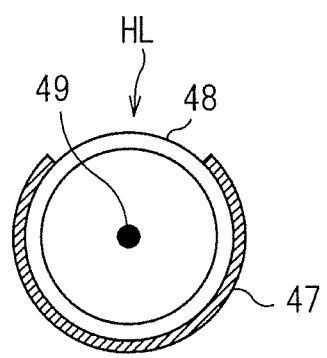
FIG. 9 is a view showing the reflector provided on a halogen lamp in a location where the halogen lamps in the upper and lower tiers do not overlap each other.

In addition to the reflector 43 for the entire halogen heating part 4, individual reflectors are provided for the respective halogen lamps HL. FIGS. 8 and 9 are sectional views of the rod-shaped halogen lamps HL taken in a direction perpendicular to the longitudinal direction thereof. FIGS. 8 and 9 differ from each other in position in which the halogen lamps HL are taken. Each of the halogen lamps HL includes a cylindrical glass tube 48, and a filament 49 disposed in a central portion of the glass tube 48. A reflector 47 for increasing the directivity of exiting light is provided on an outer wall surface of the glass tube 48. The reflector 47 is formed by applying a ceramics-based solvent to the outer wall surface of the glass tube 48 of each of the halogen lamps HL and then drying the applied film. The configurations of the reflectors 47 provided for the halogen lamps HL differ between locations where the halogen lamps HL in the upper and lower tiers overlap each other in the arrangement of the 40 halogen lamps HL and other locations.

FIG. 8 is a view showing the reflector 47 provided on a halogen lamp HL in a location where the halogen lamps HL in the upper and lower tiers overlap each other. The location where the halogen lamps HL in the upper and lower tiers overlap each other refers to a location where a halogen lamp HL in the upper tier and a halogen lamp HL in the lower tier intersect each other, for example, as indicated by the reference character A in FIG. 7. In the present preferred embodiment, there are multiple locations where the halogen lamps HL in the upper and lower tiers overlap each other as indicated by the reference character A in FIG. 7 because the halogen lamps HL are arranged in two tiers, i.e. upper and lower tiers, to intersect each other in a lattice pattern. In such a location where the halogen lamps HL in the upper and lower tiers overlap each other, the reflector 47 is provided such that the outer wall surface of the glass tube 48 of a halogen lamp HL in each of the upper and lower tiers is open on upper and lower sides, as shown in FIG. 8. Specifically, the reflector 47 is provided to cover an area extending for 90 degrees of the outer wall surface on each of the opposite lateral sides of the glass tube 48 as seen from the center of the glass tube 48 (the position of the filament 49). As a result, an area extending for 90 degrees of the outer wall surface on each of the upper and lower sides of the glass tube 48 as seen from the center of the glass tube 48 is open.

FIG. 9 is a view showing the reflector 47 provided on a halogen lamp HL in a location where the halogen lamps HL in the upper and lower tiers do not overlap each other. Such locations where the halogen lamps HL in the upper and lower tiers do not overlap each other refer to regions of the halogen lamps HL other than the locations where the halogen lamps HL in the upper and lower tiers overlap each other as indicated by the reference character A in FIG. 7. In such a location where the halogen lamps HL in the upper and lower tiers do not overlap each other, the reflector 47 is provided such that the outer wall surface of the glass tube 48 of a halogen lamp HL is open only on the upper side, as shown in FIG. 9. Specifically, the reflector 47 is provided to cover an area extending for 270 degrees of the outer wall surface from the left-hand side of the glass tube 48 through the lower side thereof to the right-hand side thereof as seen from the center of the glass tube 48. As a result, an area extending for 90 degrees of the outer wall surface on the upper side of the glass tube 48 as seen from the center of the glass tube 48 is open.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined processing program, whereby the processes in the heat treatment apparatus 1 proceed.

The heat treatment apparatus 1 further includes, in addition to the aforementioned components, various cooling structures to prevent an excessive temperature rise in the halogen heating part 4, the flash heating part 5 and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Next, a procedure for the treatment of a semiconductor wafer W in the heat treatment apparatus 1 will be described. A semiconductor wafer W to be treated herein is a semiconductor substrate doped with impurities (ions) by an ion implantation process. The impurities are activated by the heat treatment apparatus 1 performing the process of heating (annealing) the semiconductor wafer W by irradiation with a flash of light. The procedure for the treatment in the heat treatment apparatus 1 which will be described below proceeds under the control of the controller 3 over the operating mechanisms of the heat treatment apparatus 1.

First, the valve 84 for supply of gas is opened, and the valves 89 and 192 for exhaust of gas are opened, so that the supply and exhaust of gas into and out of the chamber 6 start. When the valve 84 is opened, nitrogen gas is supplied through the gas supply opening 81 into the heat treatment space 65. When the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

The gas within the chamber 6 is exhausted also through the transport opening 66 by opening the valve 192. Further, the exhaust mechanism not shown exhausts an atmosphere near the drivers of the transfer mechanism 10. It should be noted that the nitrogen gas is continuously supplied into the heat treatment space 65 during the heat treatment of a semiconductor wafer W in the heat treatment apparatus 1. The amount of nitrogen gas supplied into the heat treatment space 65 is changed as appropriate in accordance with process steps.

Subsequently, the gate valve 185 is opened to open the transport opening 66. A transport robot outside the heat treatment apparatus 1 transports a semiconductor wafer W subjected to the ion implantation through the transport opening 66 into the heat treatment space 65 of the chamber 6. At this time, there is a danger that an atmosphere outside the heat treatment apparatus 1 is carried into the heat treatment space 65 as the semiconductor wafer W is transported into the heat treatment space 65. However, nitrogen gas is continuously supplied into the chamber 6. Thus, the nitrogen gas flows outwardly through the transport opening 66 to minimize the outside atmosphere carried into the heat treatment space 65.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holder 7 in such an attitude that the front surface thereof patterned and implanted with impurities is the upper surface. A predetermined distance is defined between the back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

After the semiconductor wafer W is held in a horizontal attitude from below by the susceptor 74 of the holder 7 made of quartz, the 40 halogen lamps HL in the halogen heating part 4 turn on simultaneously to start preheating (or assist-heating). Halogen light emitted from the halogen lamps HL is transmitted through the lower chamber window 64 and the susceptor 74 both made of quartz, and impinges upon the lower surface of the semiconductor wafer W. By receiving halogen light irradiation from the halogen lamps HL, the semiconductor wafer W is preheated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The temperature of the semiconductor wafer W is measured with the radiation thermometer 20 when the halogen lamps HL perform the preheating. Specifically, the radiation thermometer 20 receives infrared radiation emitted from the lower surface of the semiconductor wafer W held by the susceptor 74 through the opening 78 and passing through the transparent window 21 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined preheating temperature T1 or not. In other words, the controller 3 effects feedback control of the output from the halogen lamps HL so that the temperature of the semiconductor wafer W is equal to the preheating temperature T1, based on the value measured with the radiation thermometer 20. The preheating temperature T1 shall be on the order of 200° to 800° C., preferably on the order of 350° to 600° C., (in the present preferred embodiment, 600° C.) at which there is no apprehension that the impurities implanted in the semiconductor wafer W are diffused by heat.

After the temperature of the semiconductor wafer W reaches the preheating temperature T1, the controller 3 maintains the temperature of the semiconductor wafer W at the preheating temperature T1 for a short time. Specifically, at the point in time when the temperature of the semiconductor wafer W measured with the radiation thermometer 20 reaches the preheating temperature T1, the controller 3 adjusts the output from the halogen lamps HL to maintain the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in the peripheral portion thereof where heat dissipation is liable to occur than in the central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating.

Figure 10:
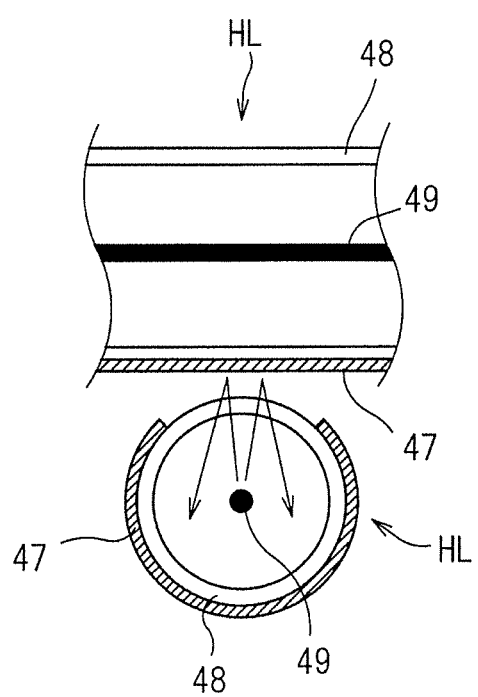
FIG. 10 is a view showing a phenomenon occurring in a location where the halogen lamps in the upper and lower tiers overlap each other when the reflector is provided over a wide area.

To increase the directivity of light exiting the halogen lamps HL, the reflector 47 is provided on the outer wall surface of the glass tube 48 of each of the halogen lamps HL. Supposing that the reflector 47 is provided along the entire length of the glass tube 48 to cover the area extending for 270 degrees from the lateral sides of the glass tube 48 to the lower side thereof as shown in FIG. 9, a problem to be described below comes up. FIG. 10 is a view showing a phenomenon occurring in a location where the halogen lamps HL in the upper and lower tiers overlap each other when the reflector 47 is provided over a wide area.

If the reflector 47 is provided to cover the area extending for 270 degrees of the outer wall surface from the left-hand side of the glass tube 48 through the lower side thereof to the right-hand side thereof, only the area extending for 90 degrees of the outer wall surface on the upper side of the glass tube 48 is open. Thus, light emitted from the filament 49 of a halogen lamp HL in the lower tier exits only the open upper portion of the glass tube 48.

However, if the reflector 47 is provided to cover the area extending for 270 degrees from the lateral sides of the glass tube 48 to the lower side thereof, the reflector 47 of a halogen lamp HL in the upper tier is present immediately over the halogen lamp HL in the lower tier in the location where the halogen lamps HL in the upper and lower tiers overlap each other. Thus, light emitted upwardly from the halogen lamp HL in the lower tier is reflected downwardly by the reflector 47 of the halogen lamp HL in the upper tier to enter the glass tube 48 of the halogen lamp HL in the lower tier again. As a result, the light emitted from the halogen lamp HL in the lower tier is prevented from traveling toward the chamber 6, and repeats multiple reflection in the glass tube 48 in the lower tier, so that a support ring (not shown) holding down the filament 49 is abnormally heated. The excessive heating of the support ring causes the breakage of the glass tube 48 due to melting. As a result, the atmosphere flows into the glass tube 48 to also cause the breakage of the filament 49.

To overcome such a problem in the present preferred embodiment, the reflector 47 is provided such that the outer wall surface of the glass tube 48 of a halogen lamp HL in each of the upper and lower tiers is open on the upper and lower sides, as shown in FIG. 8, in the location where the halogen lamps HL in the upper and lower tiers overlap each other. FIG. 11 is a view showing a phenomenon occurring in a location where the halogen lamps HL in the upper and lower tiers overlap each other when the reflector 47 is provided such that the upper and lower portions thereof are open. It should be noted that FIG. 10 shows a section of the halogen lamp HL in the upper tier, whereas FIG. 11 shows a side surface of the halogen lamp HL in the upper tier.

When the reflector 47 is provided to cover the area extending for 90 degrees of the outer wall surface on each of the opposite lateral sides of the glass tube 48, the area extending for 90 degrees of the outer wall surface on each of the upper and lower sides of the glass tube 48 is open (FIG. 8). When the area extending for 90 degrees of the outer wall surface on each of the upper and lower sides of the glass tube 48 is open, light emitted from the filament 49 of the halogen lamp HL in the lower tier exits the open upper and lower portions of the glass tube 48.

In the location where the halogen lamps HL in the upper and lower tiers overlap each other, the area extending for 90 degrees of the outer wall surface on each of the upper and lower sides of the glass tube 48 is open also in the halogen lamp HL in the upper tier. Thus, light emitted upwardly from the halogen lamp HL in the lower tier is transmitted through the open upper and lower portions of the outer wall surface of the glass tube 48 of the halogen lamp HL in the upper tier to enter the chamber 6 through the lower chamber window 64. As a result, the problem that the light emitted from the halogen lamp HL in the lower tier travels back to the glass tube 48 in the lower tier and repeats multiple reflection therein is avoided. This prevents the breakage of the glass tube 48 resulting from the abnormal heating of the support ring.

In the location where the halogen lamps HL in the upper and lower tiers do not overlap each other, on the other hand, the reflector 47 is provided to cover the area extending for 270 degrees of the outer wall surface from the left-hand side of the glass tube 48 through the lower side thereof to the right-hand side thereof, as shown in FIG. 11. In the location where the halogen lamps HL in the upper and lower tiers do not overlap each other, light emitted upwardly from the halogen lamp HL in the lower tier directly enters the chamber 6 through the lower chamber window 64, so that the aforementioned problem does not arise. The provision of such reflectors 47 increases the directivity of light exiting the respective halogen lamps HL to provide a more uniform in-plane temperature distribution of the semiconductor wafer W in the stage of preheating.

The flash lamps FL in the flash heating part 5 irradiate the front surface of the semiconductor wafer W held by the susceptor 74 with a flash of light at the time when a predetermined time period has elapsed since the temperature of the semiconductor wafer W reached the preheating temperature T1. At this time, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such flashes of light achieves the flash heating of the semiconductor wafer W.

The flash heating, which is achieved by the emission of a flash of light from the flash lamps FL, is capable of increasing the temperature of the front surface of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The temperature of the front surface of the semiconductor wafer W subjected to the flash heating by the flash irradiation from the flash lamps FL momentarily increases to a treatment temperature T2 of 1000° C. or higher. After the impurities implanted in the semiconductor wafer W are activated, the temperature of the front surface of the semiconductor wafer W decreases rapidly. Because of the capability of increasing and decreasing the temperature of the front surface of the semiconductor wafer W in an extremely short time, the heat treatment apparatus 1 achieves the activation of the impurities implanted in the semiconductor wafer W while suppressing the diffusion of the impurities due to heat. It should be noted that the time required for the activation of the impurities is extremely short as compared with the time required for the thermal diffusion of the impurities. Thus, the activation is completed in a short time ranging from about 0.1 to about 100 milliseconds during which no diffusion occurs.

After a predetermined time period has elapsed since the completion of the flash heating treatment, the halogen lamps HL turn off. This causes the temperature of the semiconductor wafer W to decrease rapidly from the preheating temperature T1. The radiation thermometer 20 measures the temperature of the semiconductor wafer W which is on the decrease. The result of measurement is transmitted to the controller 3. The controller 3 monitors whether the temperature of the semiconductor wafer W is decreased to a predetermined temperature or not, based on the result of measurement with the radiation thermometer 20. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 to the outside. Thus, the heat treatment apparatus 1 completes the heating treatment of the semiconductor wafer W.

In the present preferred embodiment, the reflector 47 is provided such that the outer wall surface of the glass tube 48 of a halogen lamp HL in each of the upper and lower tiers is open on the upper and lower sides in the location where the halogen lamps HL in the upper and lower tiers overlap each other. Thus, light emitted upwardly from the halogen lamp HL in the lower tier is transmitted through the open upper and lower portions of the outer wall surface of the glass tube 48 of the halogen lamp HL in the upper tier, and is directed further upwardly. Thus, the light is prevented from entering the glass tube 48 of the halogen lamp HL in the lower tier again. As a result, this prevents the breakage of the glass tube 48 resulting from the abnormal heating of the support ring.

While the preferred embodiment according to the present invention has been described hereinabove, various modifications of the present invention in addition to those described above may be made without departing from the scope and spirit of the invention. For example, in the locations where the halogen lamps HL in the upper and lower tiers do not overlap each other, the reflector 47 may also be provided such that the outer wall surface of the glass tube 48 of each halogen lamp HL is open on the upper and lower sides. When light emitted from the filament 49 has a high energy density, the provision of the reflector 47 covering the area extending for 270 degrees of the outer wall surface from the left-hand side of the glass tube 48 through the lower side thereof to the right-hand side thereof as shown in FIG. 9 might cause the breakage of the glass tube 48 resulting from the abnormal heating of the support ring even in the absence of any halogen lamp HL thereover. In such a case, the reflector 47 is provided such that the outer wall surface of the glass tube 48 of each halogen lamp HL is open on the upper and lower sides in the locations where the halogen lamps HL in the upper and lower tiers do not overlap each other, whereby light emitted from the filament 49 exits the open upper and lower portions of the glass tube 48. This prevents the breakage of the glass tube 48.

In the aforementioned preferred embodiment, the reflector 47 is provided such that the area extending for 90 degrees of the outer wall surface on each of the upper and lower sides of the glass tube 48 is open. However, the angle of the open area is not limited to 90 degrees. As the angle of the open area of the outer wall surface on each of the upper and lower sides of the glass tube 48 decreases, the directivity of exiting light increases, whereas the risk of breakage of the glass tube 48 increases due to the decreasing light exiting area. Conversely, as the angle of the open area of the outer wall surface on each of the upper and lower sides of the glass tube 48 increases, the risk of breakage of the glass tube 48 decreases, whereas the directivity of exiting light decreases.

Although the 30 flash lamps FL are provided in the flash heating part 5 in the aforementioned preferred embodiment, the present invention is not limited to this. Any number of flash lamps FL may be provided. The flash lamps FL are not limited to the xenon flash lamps, but may be krypton flash lamps.

Also, the number of halogen lamps HL provided in the halogen heating part 4 is not limited to 40. Any number of halogen lamps HL may be provided. Further, the arrangement of the halogen lamps HL is not limited to that in two tiers, i.e. upper and lower tiers, but the halogen lamps HL may be arranged in one tier in a plane. When the halogen lamps HL are arranged in one tier, there are no locations where the halogen lamps HL in the upper and lower tiers overlap each other, but the reflector 47 may be provided such that the outer wall surface of the glass tube 48 of each halogen lamp HL is open on the upper and lower sides for the purpose of preventing the breakage of the glass tube 48 resulting from the emission of light having a high energy density from the filament 49 as mentioned above.

A reflector may be provided for each of the flash lamps FL of the flash heating part 5 in such a manner that the outer wall surface of the glass tube of each flash lamp FL is open on the upper and lower sides, as in the aforementioned preferred embodiment. The provision of the reflector similar to that of the aforementioned preferred embodiment on the glass tube of each of the flash lamps FL prevents the breakage of the glass tube while increasing the directivity of flashes of light.

Moreover, a substrate to be treated by the heat treatment apparatus according to the present invention is not limited to a semiconductor wafer, but may be a glass substrate for use in a flat panel display for a liquid crystal display apparatus and the like, and a substrate for a solar cell. Also, the technique according to the present invention may be applied to the heat treatment of high dielectric constant gate insulator films (high-k films), to the joining of metal and silicon, and to the crystallization of polysilicon.

Also, the technique according to the present invention is not limited to the flash lamp annealer, but may be applied to single-wafer type lamp annealers employing halogen lamps and CVD apparatuses. In such lamp annealers, halogen lamps similar to those of the aforementioned preferred embodiment may be provided over a chamber. When the halogen lamps are provided over the chamber, the reflector 47 is provided such that the outer wall surface of the glass tube 48 of each halogen lamp HL is open only on the lower side in the locations where the halogen lamps HL in the upper and lower tiers do not overlap each other.

Depending on the arrangement of the halogen lamps HL, the reflector 47 is not necessarily required to be provided such that the outer wall surface of the glass tube 48 of each halogen lamp HL is open on the upper and lower sides, but the reflector 47 may be provided such that the outer wall surface of the glass tube 48 of each halogen lamp HL is open on one side of the glass tube 48 as seen in a radial direction thereof and on the other side thereof opposite the one side.

In the aforementioned preferred embodiment, the filament-type halogen lamps HL are used as continuous lighting lamps that emit light continuously for not less than one second to preheat the semiconductor wafer W. The present invention, however, is not limited to this. In place of the halogen lamps HL, discharge type arc lamps (e.g., xenon arc lamps) may be used as continuous lighting lamps to preheat the semiconductor wafer W. In this case, the reflector 47 similar to that of the aforementioned preferred embodiment may be provided on each of the discharge type arc lamps.

While the invention has been described in detail, the foregoing description is in all aspects illustrative and not restrictive. It is understood that numerous other modifications and variations can be devised without departing from the scope of the invention.

What is claimed is:

1. A heat treatment apparatus for heating a substrate by irradiating the substrate with light, comprising:
   a chamber for receiving a substrate therein;
   a holder for holding said substrate in said chamber; and
   a plurality of rod-shaped lamps provided over or under said chamber and for irradiating said substrate held by said holder with light,
   wherein said rod-shaped lamps is arranged in two, upper and lower, tiers in a lattice pattern,
   wherein each of said rod-shaped lamps includes:
      a cylindrical glass tube; and
      a reflector provided on an outer wall surface of said glass tube,
   wherein, as seen from a center of said glass tube, said reflector is provided to cover
      (1) said outer wall surface except upper and lower sides of said glass tube in a first location where said rod-shaped lamps in the upper and lower tiers overlap each other, and
      (2) said outer wall surface except the upper side when the plurality of rod shaped lamps is provided under said chamber, or said outer wall surface except the lower side when the plurality of rod-shaped lamps is provided over said chamber, of said glass tube in a second location where said rod-shaped lamps in the upper and lower tiers do not overlap each other.

2. The heat treatment apparatus according to claim 1, wherein said rod-shaped lamps are continuous lighting lamps.

3. A heat treatment apparatus for heating a substrate by irradiating the substrate with light, comprising:
   a chamber for receiving a substrate therein;
   a holder for holding said substrate in said chamber; and
   a plurality of rod-shaped lamps provided over or under said chamber and for irradiating said substrate held by said holder with light,
   wherein said rod-shaped lamps is arranged in two, upper and lower, tiers in a lattice pattern,
   wherein each of said rod-shaped lamps includes:
      a cylindrical glass tube; and
      a reflector provided on an outer wall surface of said glass tube,
   wherein, as seen from a center of said glass tube, said reflector is provided to cover
      (1) said outer wall surface except upper and lower sides of said glass tube in a first location where said rod-shaped lamps in the upper and lower tiers overlap each other, and
      (2) said outer wall surface from a lateral side to another lateral side of said glass tube through the upper side when the plurality of rod shaped lamps is provided under said chamber, or said outer wall surface from a lateral side to another lateral side of said glass tube through the lower side when the plurality of rod-shaped lamps is provided over said chamber, in a second location where said rod-shaped lamps in the upper and lower tiers do not overlap each other.

4. The heat treatment apparatus according to claim 1, wherein
   the reflector is provided to cover an area extending for 90 degrees of said outer wall surface on each of lateral sides of said glass tube as seen from the center of said glass tube in the first location where said rod-shaped lamps in the upper and lower tiers overlap each other.

5. The heat treatment apparatus according to claim 3, wherein
   the reflector is provided to cover an area extending 90 degrees of said outer wall surface on each of the lateral sides of said glass tube as seen from the center of said glass tube in the first location where said rod-shaped lamps in the upper and lower tiers overlap each other.

* * * * *